United States Patent
Jindal et al.

(10) Patent No.: US 11,480,865 B2
(45) Date of Patent: Oct. 25, 2022

(54) METHOD AND APPARATUS TO IMPROVE EUV MASK BLANK FLATNESS

(71) Applicant: Applied Materials, Inc., Santa Clara, CA (US)

(72) Inventors: Vibhu Jindal, San Jose, CA (US); Sanjay Bhat, Singapore (SG); Wen Xiao, Singapore (SG); Vinodh Ramachandran, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 158 days.

(21) Appl. No.: 17/120,789

(22) Filed: Dec. 14, 2020

(65) Prior Publication Data

US 2022/0187698 A1 Jun. 16, 2022

(51) Int. Cl.
*G03F 1/24* (2012.01)
*G03F 1/60* (2012.01)

(52) U.S. Cl.
CPC . *G03F 1/24* (2013.01); *G03F 1/60* (2013.01)

(58) Field of Classification Search
CPC .................................... G03F 1/24; G03F 1/60
USPC ............................................................. 430/5
See application file for complete search history.

(56) References Cited

U.S. PATENT DOCUMENTS

| 8,241,821 B2* | 8/2012 | Ikuta ........................ G03F 1/24 |
| | | 430/5 |
| 9,423,684 B2* | 8/2016 | Maeshige ................. G03F 1/24 |
| 9,618,836 B2* | 4/2017 | Kageyama .............. C23C 14/35 |

* cited by examiner

*Primary Examiner* — Christopher G Young
(74) *Attorney, Agent, or Firm* — Servilla Whitney LLC (57) ABSTRACT

Apparatus and methods for improving flatness of extreme ultraviolet (EUV) mask blanks are disclosed. The apparatus and methods may utilize one or more of heating the backside and/or the front side of the EUV mask blank and a cooling system. Interfacial layers of the EUV mask blank are selectively heated, resulting in improved flatness of the EUV mask blanks.

20 Claims, 7 Drawing Sheets

METHOD AND APPARATUS TO IMPROVE EUV MASK BLANK FLATNESS

TECHNICAL FIELD

The present disclosure relates generally to extreme ultraviolet lithography, and more particularly extreme ultraviolet mask blanks with improved flatness, including apparatus and methods to provide the same.

BACKGROUND

Extreme ultraviolet (EUV) lithography, also known as soft x-ray projection lithography, is used for the manufacture of 0.0135 micron and smaller minimum feature size semiconductor devices. Semiconductor device features will continue to shrink according to Moore's law. Extreme ultraviolet light, which is generally in the 5 to 100 nanometer wavelength range, is strongly absorbed in virtually all materials. For that reason, extreme ultraviolet systems work by reflection rather than by transmission of light. Through the use of reflective elements including photomasks and reticles made from EUV mask blanks, patterned actinic light is reflected onto a resist-coated semiconductor substrate.

The photomasks and reticles used in extreme ultraviolet lithography systems are coated with reflective multilayer coatings of materials such as molybdenum and silicon. Reflection values of approximately 62-70% per reflective element have been obtained by using substrates that are coated with multilayer coatings that strongly reflect light within an extremely narrow ultraviolet bandpass, for example, 12.5 to 14.5 nanometer bandpass for 13.5 nanometer ultraviolet light.

Figure 1:
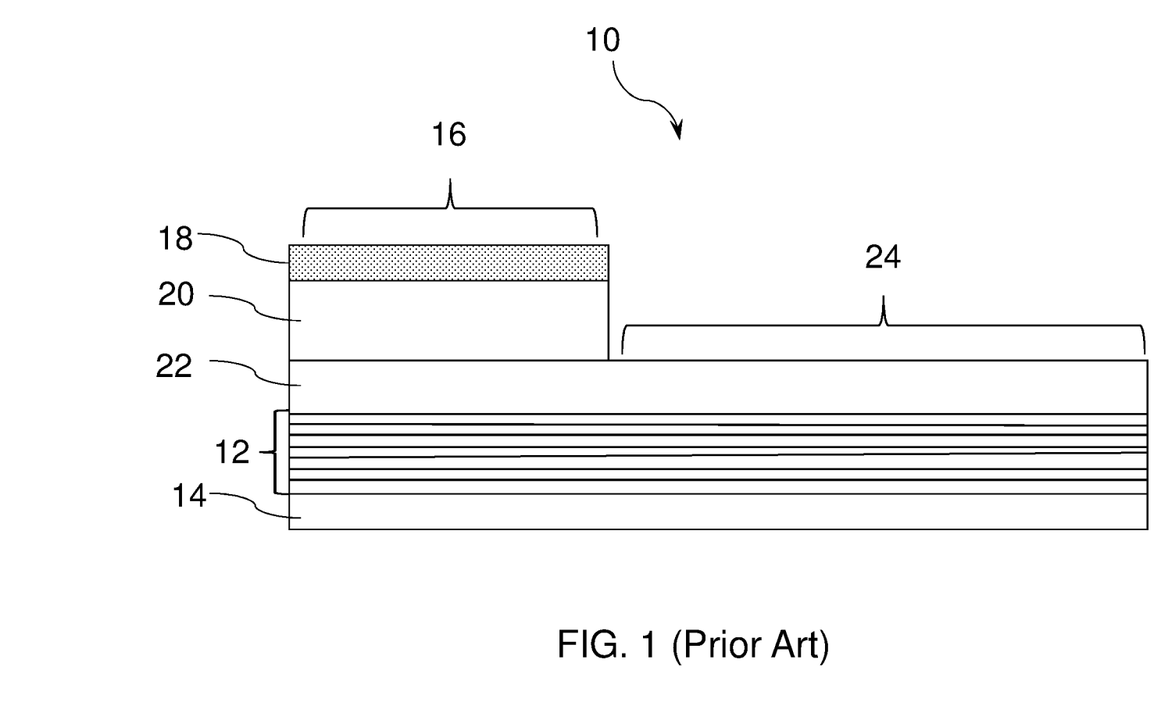
FIG. 1 schematically illustrates a prior art EUV reflective photomask.

FIG. 1 shows a conventional EUV reflective photomask 10, which is formed from an EUV mask blank, which includes a reflective multilayer stack 12 on a substrate 14, which reflects EUV radiation at unmasked portions by Bragg interference. Masked (non-reflective) areas 16 of the conventional EUV reflective photomask 10 are formed by etching buffer layer 18 and absorber layer 20. The absorber layer 20 typically has a thickness in a range of 51 nm to 77 nm. A capping layer 22 is formed over the reflective multilayer stack 12 and protects the reflective multilayer stack 12 during the etching process. As will be discussed further below, EUV mask blanks are made on a low thermal expansion material substrate coated with multilayers, a capping layer and an absorbing layer, which is then etched to provide the masked (non-reflective) areas 16 and reflective areas 24.

The International Technology Roadmap for Semiconductors (ITRS) specifies a node's overlay requirement as some percentage of a technology's minimum half-pitch feature size. Due to the impact on image placement and overlay errors inherent in all reflective lithography systems, EUV reflective masks will need to adhere to more precise flatness specifications for future production. For example, photomasks and reticles in current EUV photolithography systems should have a peak-to-valley (PV) front side flatness of less than 16 nm. Systems for future semiconductor nodes will eventually need front side flatness peak-to-valley (PV) of 8 nm and less. A backside flatness requirement for photomasks and reticles is also becoming increasingly stringent from bow of 300 nm for 16 nm half-pitch to 250 nm for 13 nm half-pitch. In view of these flatness requirements, apparatus and systems are needed for the production of photomask blanks that provided improved flatness.

SUMMARY

One or more embodiments of the disclosure are directed to a method of manufacturing an extreme ultraviolet (EUV) mask blank. The method comprises heating the EUV mask blank comprising a multilayer stack which reflects EUV radiation on a front side of a substrate having the front side and a backside opposite the front side, the multilayer stack comprising a number X of reflective layer pairs, wherein an x is in a range of from 30 to 60; selectively heating a number Y reflective layer pairs adjacent to the substrate to a first temperature, wherein Y is an integer in a range of from 1 to 20; and maintaining reflective layer pairs above the Y reflective layer pairs at a second temperature that is less than the first temperature.

Additional embodiments of the disclosure are directed to apparatus configured to selectively heat a portion of an EUV mask blank. The apparatus comprises a chamber including a pedestal configured to support the EUV mask blank; an EUV mask blank handling fixture including a carrier base and a top shield configured to hold the EUV mask blank on the pedestal during a selective heating process in the chamber; lift pins configured to raise the top shield above the EUV mask blank during the selective heating process and a pad configured to separate the EUV mask blank from the carrier base during the selective heating process; and a light source positioned and configured to direct light toward the pedestal and to selectively heat a first portion of the EUV mask blank to a first temperature while maintaining a second portion of the EUV mask blank at a second temperature lower than the first temperature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate refers to only a portion of the substrate, unless the context clearly indicates otherwise. Additionally, reference to depositing on a substrate means both a bare substrate and a substrate with one or more films or features deposited or formed thereon.

Figure 2A:
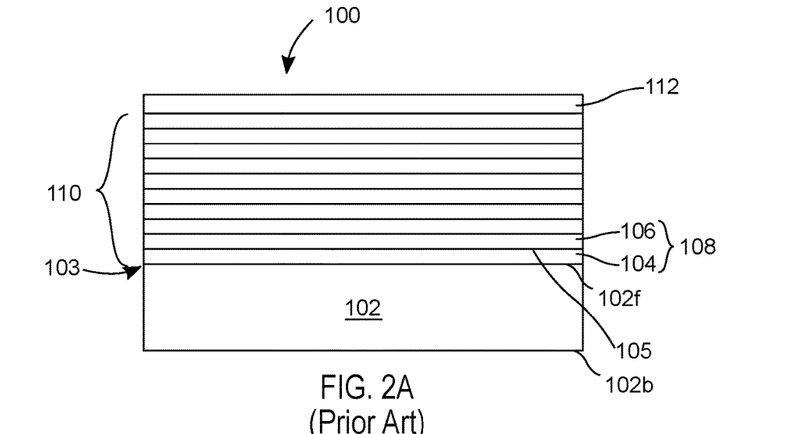
FIG. 2A schematically illustrates a prior art EUV mask blank.
Figure 2B:
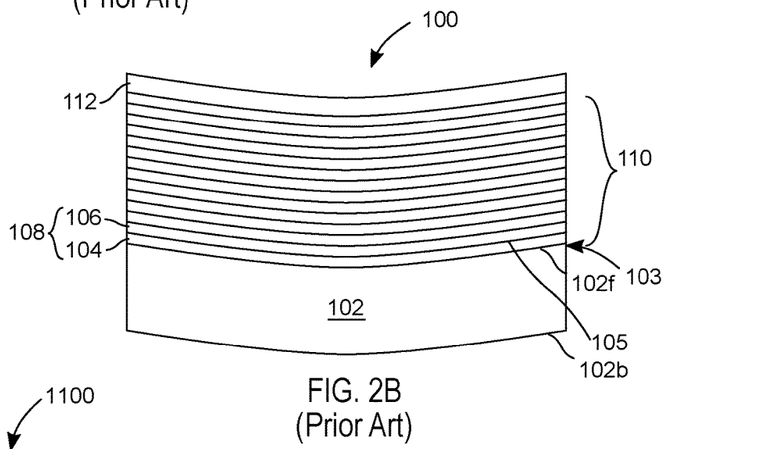
FIG. 2B schematically illustrates a prior art EUV mask blank under compressive stress.
Figure 2C:
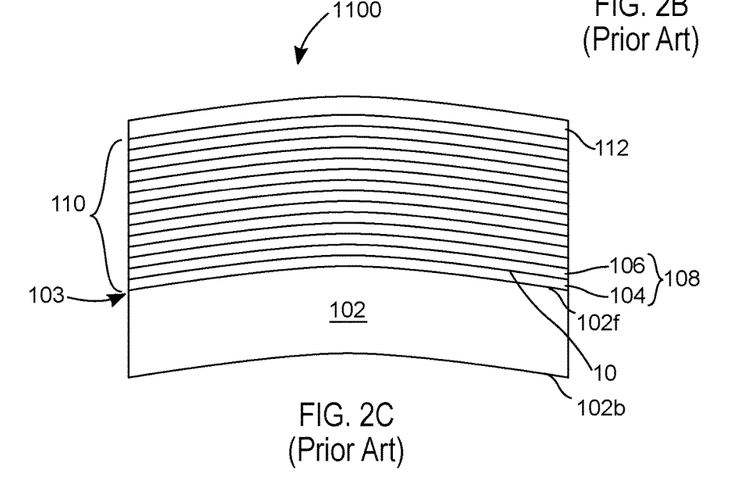
FIG. 2C schematically illustrates a prior art EUV mask blank under tensile stress.

Referring now to FIG. 2A, a prior art EUV mask blank 100 is shown. The EUV mask blank 100 comprises a flat substrate 102 (for example, a low expansion glass (e.g., ULE glass)) substrate having lateral dimensions of 6 inches×6 inches (152 mm×152 mm) and a thickness of 0.25 inches (6.3 mm). A multilayer stack 110 which reflects EUV radiation is on a front side 102$f$ of the substrate 102. The multilayer stack 110 comprises alternating layers of a first material layer 104 (e.g., molybdenum (Mo)) and a second material layer 106 (e.g., silicon (Si)) to provide a reflective layer pairs 108 that reflect EUV radiation. There are generally 20-80 reflective layer pairs 108. A capping layer 112 (e.g., ruthenium (Ru)) is on the multilayer stack 110. There is a substrate-multilayer stack interface 103 between the first material layer 104 and the front side 102$f$ of the substrate. The EUV mask blank 100 will be distorted due to compressive or tensile stress generated by multilayer stack 110. In addition, reflectance of the as-formed multilayer stack 110 is high due to a thin two material interface 105 (e.g. MoSi$_x$) between the first material layer 104 and the second material layer 106. However, flatness of the EUV mask blank 100 is poor due to stress-induced distortion of the EUV mask blank 100. FIG. 2B shows an EUV mask blank 100 subjected to tensile stress due to the multilayer stack resulting in an EUV mask blank 100 that is concave, and FIG. 2C shows an EUV mask blank 100 subjected to compressive stress due to the multilayer stack 110, resulting in an EUV mask blank 100 that is convex. Annealing processes may be utilized to heat the entire EUV mask blank 100 to relieve the stress generated by multilayer stack 1100 by to formation of a thicker two material interface 105 (e.g., MoSi$_x$). The annealing process results in the distorted EUV mask blank 100 recovering to be flat with an acceptable flatness. However, the increased thickness of the two material interface 105 (e.g., MoSi$_x$) causes the reflectance of the EUV mask blank 100 to decrease at the same time as a result of the thicker the two material interface. Disclosed herein are apparatus (or systems) and methods that provide controlled annealing process to relieve the stress caused by the multilayer stack 110 without reducing reflectance of the multilayer stack 110, which allows for the production of EUV mask blanks that meet EUV mask blank specifications on both flatness and reflectance, which was not possible by conventional annealing processes that annealed the entire EUV mask blank at the same temperature.

EUV mask blanks 200 as described herein used in the manufacture of EUV masks 10 such as the type shown in FIG. 1 and other reflective elements that reflect EUV radiation such as mirrors. The EUV mask blanks 200 described herein according to some embodiments are formed using semiconductor fabrication techniques. The reflective elements are efficient reflectors of the extreme ultraviolet light, e.g., light in a wavelength range of from 12 nm to 14 nm, such as 13.5 nm.

The EUV mask blank 200 according to one or more embodiments includes a flat substrate 202 (for example, a low expansion glass (e.g., ULE glass)) substrate having lateral dimensions of 6 inches×6 inches (152 mm×152 mm) and a thickness of 0.25 inches (6.3 mm). A multilayer stack 210 which reflects EUV radiation is on a front side 202$f$ of the substrate 202. The multilayer stack 210 comprises alternating layers of a first material layer 204 (e.g., molybdenum (Mo)) and a second material layer 206 (e.g., silicon (Si)) to provide a reflective layer pairs 208 that reflect EUV radiation. There are generally 20-80 reflective layer pairs 208. A capping layer 212 (e.g., ruthenium (Ru)) is on the multilayer stack 210. There is a substrate-multilayer stack interface 203 between the first material layer 204 and the front side 202$f$ of the substrate. There is a thin two material interface 205 (e.g. MoSi$_x$) between the first material layer 204 (e.g., Mo) and the second material layer 206 (e.g., Si).

The EUV mask blank 200 is an optically flat structure used for forming an EUV reflective mask such as EUV reflective mask 10 in FIG. 1 and having a mask pattern. In one or more embodiments, the reflective surface of the EUV mask blank 200 forms a flat focal plane for reflecting incident extreme ultraviolet light in an EUV lithography system.

The substrate 202 is an element for providing structural support to the layers of the EUV mask blank 200. In one or more embodiments, the substrate 202 is made from a material having a low coefficient of thermal expansion (CTE) to provide stability during temperature changes. In one or more embodiments, the substrate 202 has properties such as stability against mechanical cycling, thermal cycling, crystal formation, or a combination thereof. The substrate 202 according to one or more embodiments is formed from a material such as silicon, glass, oxides, ceramics, glass ceramics, or a combination thereof. In specific embodiments, the substrate 202 is fused silica or an ultra low thermal expansion aluminosilicate glass. In specific embodiments, the substrate is an ultra low thermal expansion glass (e.g., ULE® glass available from Corning, Inc. or Zerodur® low expansion lithium aluminosilicate glass). In one or more embodiments, the substrate 202 front side 202f has a surface roughness of less than or equal to 0.03 nm.

The multilayer stack 210 is a structure that is reflective to extreme ultraviolet light. The multilayer stack 210 includes alternating reflective layers of a first material layer 204 and a second material layer 206. The first material layer 204 and the second material layer 206 form a reflective layer pair 208. In a non-limiting embodiment, the multilayer stack 210 includes a range of 20-80 (e.g., 30-70, 40-60, or 50) of the reflective layer pairs 208.

The first material layer 204 and the second material layer 206 in some embodiments are formed from a variety of materials. In an embodiment, the first material layer 204 and the second material layer 206 are formed from silicon and molybdenum, respectively. Although the layers are shown as silicon and molybdenum, it is understood that the alternating layers in some embodiments are formed from other materials or have other internal structures.

The first material layer 204 and the second material layer 206 in some embodiments have a variety of structures. In an embodiment, both the first material layer 204 and the second material layer 206 are formed with a single layer, multiple layers, a divided layer structure, non-uniform structures, or a combination thereof. The multilayer stack 210 forms a reflective structure by having alternating thin layers of materials with different optical properties to create a Bragg reflector or mirror.

In an embodiment, each of the alternating layers has dissimilar optical constants for extreme ultraviolet light. The alternating layers provide a resonant reflectivity when the period of the thickness of the alternating layers is one half the wavelength of the extreme ultraviolet light. In an embodiment, for the extreme ultraviolet light at a wavelength of 13.5 nm, the alternating layers are about 6.5 nm thick. It is understood that the sizes and dimensions provided are within normal engineering tolerances for typical elements.

The multilayer stack 210 in some embodiments is formed in a variety of ways. In an embodiment, the first material layer 204 and the second material layer 206 are formed with magnetron sputtering, ion sputtering systems, pulsed laser deposition, cathode arc deposition, or a combination thereof.

In an illustrative embodiment, the multilayer stack 210 is formed using a physical vapor deposition technique, such as magnetron sputtering. In an embodiment, the first material layer 204 and the second material layer 206 of the multilayer stack 210 have the characteristics of being formed by the magnetron sputtering technique including precise thickness, low roughness, and clean interfaces between the layers. In an embodiment, the first material layer 204 and the second material layer 206 of the multilayer stack 210 have the characteristics of being formed by the physical vapor deposition including precise thickness, low roughness, and clean interfaces between the layers.

The physical dimensions of the layers of the multilayer stack 210 formed using the physical vapor deposition technique in some embodiments is precisely controlled to increase reflectivity. In an embodiment, the first material layer 204, such as a layer of silicon, has a thickness of 4.1 nm. The second material layer 206, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm in some embodiments is reduced.

In an embodiment, the multilayer stack 210 has a reflectivity of greater than 60%. In an embodiment, the multilayer stack 210 formed using physical vapor deposition has a reflectivity in a range of 66%-67%. In one or more embodiments, forming the capping layer 212 over the multilayer stack 210 formed with harder materials improves reflectivity. In some embodiments, reflectivity greater than 70% is achieved using low roughness layers, clean interfaces between layers, improved layer materials, or a combination thereof.

In one or more embodiments, the capping layer 212 is a protective layer allowing the transmission of the extreme ultraviolet light. In an embodiment, the capping layer 212 is formed directly on the multilayer stack 210. In one or more embodiments, the capping layer 212 protects the multilayer stack 210 from contaminants and mechanical damage. In one embodiment, the multilayer stack 210 is sensitive to contamination by oxygen, tantalum, hydrotantalums, or a combination thereof. The capping layer 212 according to an embodiment interacts with the contaminants to neutralize them.

In one or more embodiments, the capping layer 212 is an optically uniform structure that is transparent to the extreme ultraviolet light. The extreme ultraviolet light passes through the capping layer 212 to reflect off of the multilayer stack 210. In one or more embodiments, the capping layer 212 has a total reflectivity loss of 1% to 2%. In one or more embodiments, each of the different materials has a different reflectivity loss depending on thickness, but all of them will be in a range of 1% to 2%.

In one or more embodiments, the EUV mask blank 210 has an absorber layer (such as shown in FIG. 1), which is a layer that absorbs the extreme ultraviolet light. In an embodiment, the absorber layer is used to form the pattern on the EUV reflective mask (as shown in the mask 10 in FIG. 1) by providing areas that do not reflect the extreme ultraviolet light. The absorber layer, according to one or more embodiments, comprises a material having a high absorption coefficient for a particular frequency of the extreme ultraviolet light, such as about 13.5 nm. In an embodiment, the absorber layer is formed directly on the capping layer 212, and the absorber layer is etched using a photolithography process to form the pattern of the EUV reflective mask. In one or more embodiments, the absorber layer is not formed on the multilayer stack 210 until after the EUV mask blank 200 has been selectively heated as described herein. In some embodiments, the selective heating process is performed after the absorber layer is formed on the multilayer stack.

According to one or more embodiments, forming an absorber layer over the capping layer 212 increases reliability of the EUV reflective mask blank 200. The capping layer 212 acts as an etch stop layer for the absorber layer. When a mask pattern is etched into the absorber layer (as shown in FIG. 1), the capping layer 212 beneath the absorber layer stops the etching action to protect the multilayer stack 210. In one or more embodiments, the absorber layer is etch selective to the capping layer 212.

One or more embodiments of the disclosure are directed to apparatus or systems and methods of selectively heating an EUV mask blank 200 to improve flatness of the EUV mask blank and masks made therefrom. In addition, the EUV mask blanks made by the apparatus or systems and methods described herein provide a high reflectance. In one or more embodiments, irradiation heating from a backside of an EUV mask blank is utilized to heat only a portion of the reflective layer pairs 208 that make up the multilayer stack 210 which reflects EUV radiation to a first temperature. The heating of only a portion of the reflective layer pairs 208 adjacent the interface of the substrate 202 while maintaining the remaining layers at a second temperature that is lower or cooler than the first temperature.

Figure 3:
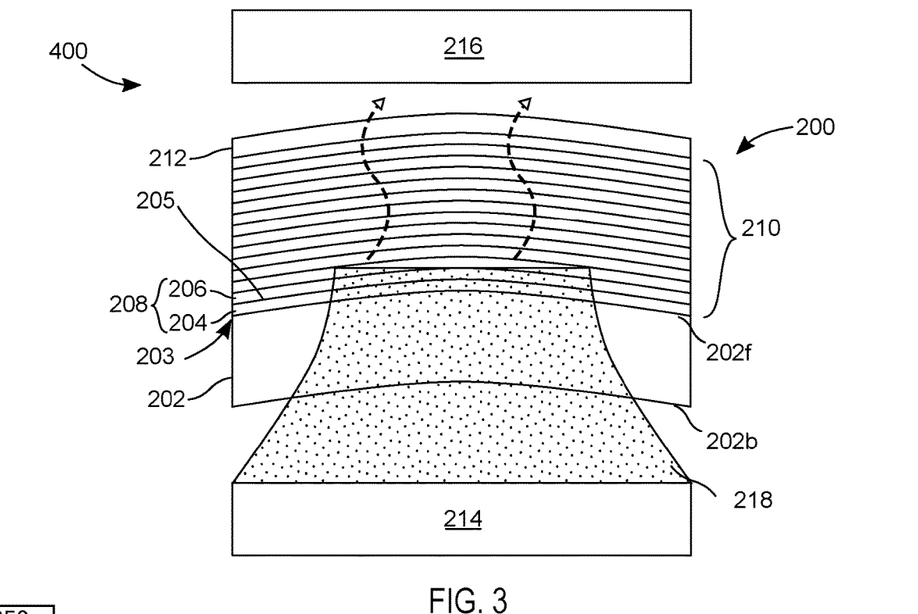
FIG. 3 schematically illustrates an embodiment of a method for improving the flatness of an EUV mask blank.

As shown in FIG. 3, a method 400 is schematically shown to selectively heat a portion of an EUV mask blank 200. In the embodiment shown, the method shows use of a heater which in some embodiments is a light source 214 directed at the backside 202b of the substrate 202 of EUV mask blank, which heats only a portion of the multilayer stack 210, namely the portion that is adjacent to the front side 202f of the substrate. During heating of only a portion of the multilayer stack 210, radiation (e.g. heat) 208 generated by the heater in the form of a light source 214 heats less than 50% of the reflective layer pairs 208, and in specific embodiment, less than 40% of the reflective layer pairs 208, less than 30% of the reflective layer pairs 208, less than 25% of the reflective layer pairs 208, less 20% of the reflective layer pairs 208, less than 19% of the reflective layer pairs 208, less than 18% of the reflective layer pairs 208, less than 17% of the reflective layer pairs 208, less 16% of the reflective layer pairs 208, less than 15% of the reflective layer pairs 208, less than 14% of the reflective layer pairs 208, less than 13% of the reflective layer pairs 208, less than 12% of the reflective layer pairs 208, less than 11% of the reflective layer pairs 208, less than 12% of the reflective layer pairs 208, less than 11% of the reflective layer pairs 208, or less than 10% of the reflective layer pairs 208 and greater than 1 reflective layer pairs 208 to a first temperature. In one or more embodiments, the number of reflective layer pairs 208 is in a range of 30-70, 40-60, or 50 reflective layer pairs 208. In the embodiment shown, the method 400 may further comprise cooling the multilayer stack 210 with a cooling device 216. The radiation 228 in the form of heat dissipates as shown by the dashed arrows in FIG. 3.

Figure 4A:
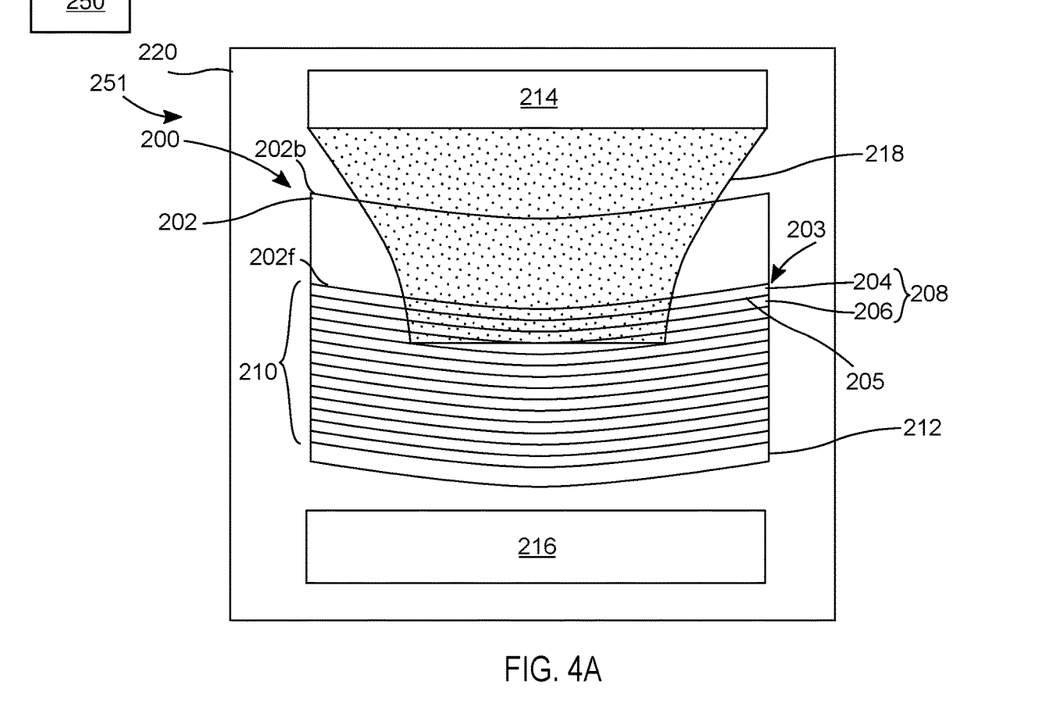
FIG. 4A illustrates an embodiment of an apparatus for improving the flatness of an EUV mask blank.

Referring now to FIG. 4A an embodiment of an apparatus 251 configured to selectively heat a portion of an EUV mask blank 200. The apparatus 251 in FIG. 4A comprises a chamber 220, which in one or more embodiments is a vacuum chamber suitable for processing semiconductor devices and EUV mask blanks. In specific embodiments, the vacuum chamber operates at a pressure in a range of from $10^{-8}$-100 Torr. The apparatus 251 as shown includes a heater or a heat source 222 positioned with respect to the EUV mask blank 200. The heat source 222 is configured to direct radiation toward the backside 202b of the substrate 202 to selectively heat a first portion of the EUV mask blank 200 to a first temperature while maintaining a second portion of the EUV mask blank at a second temperature lower than the first temperature. In one or more embodiments, the first portion of the EUV mask blank 200 is less than 50% of the reflective layer pairs 208, and in specific embodiment, less than 40% of the reflective layer pairs 208, less than 30% of the reflective layer pairs 208, less than 25% of the reflective layer pairs 208, less 20% of the reflective layer pairs 208, less than 19% of the reflective layer pairs 208, less than 18% of the reflective layer pairs 208, less than 17% of the reflective layer pairs 208, less than 16% of the reflective layer pairs 208, less than 15% of the reflective layer pairs 208, less than 14% of the reflective layer pairs 208, less than 13% of the reflective layer pairs 208, less than 12% of the reflective layer pairs 208, less than 11% of the reflective layer pairs 208, less than 12% of the reflective layer pairs 208, less than 11% of the reflective layer pairs 208, or less than 10% of the reflective layer pairs 208 and greater than 1 reflective layer pairs 208. In one or more embodiments, the number of reflective layer pairs 208 is in a range of 30-70, 40-60, or 50 reflective layer pairs 208.

In one or more embodiments, the apparatus 251 further comprises an optional cooling device 216 to cool another portion of the EUV mask blank 200, namely the reflective layer pairs 208 adjacent to the capping layer 212. The cooling device 216 according to some embodiments includes one or more of a fan, cooling coils with coolant fluid (gas or liquid flowing through the coils) and a cryocooler.

Figure 4B:
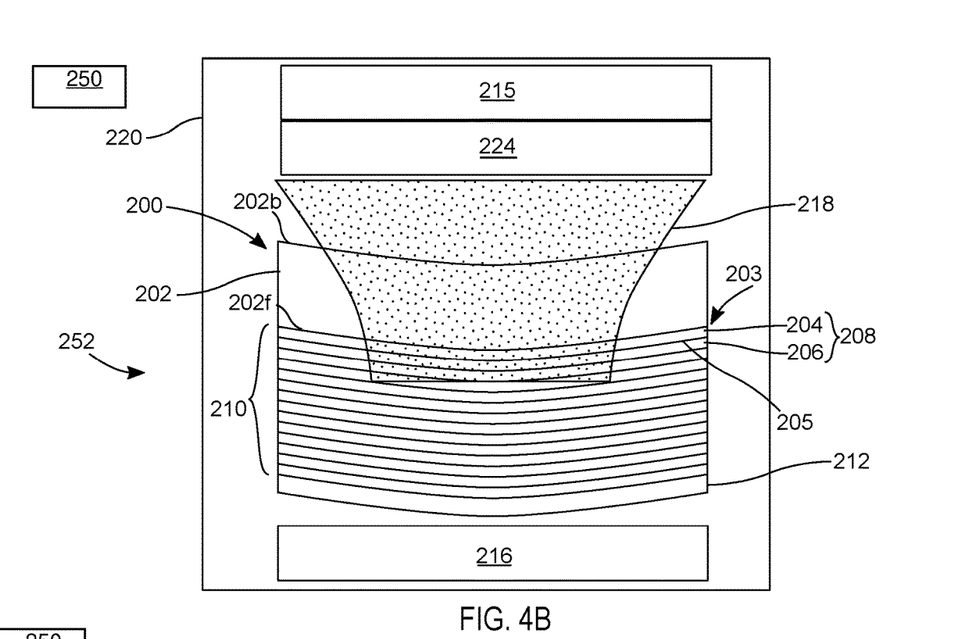
FIG. 4B illustrates an embodiment of an apparatus for improving the flatness of an EUV mask blank.
Figure 5A:
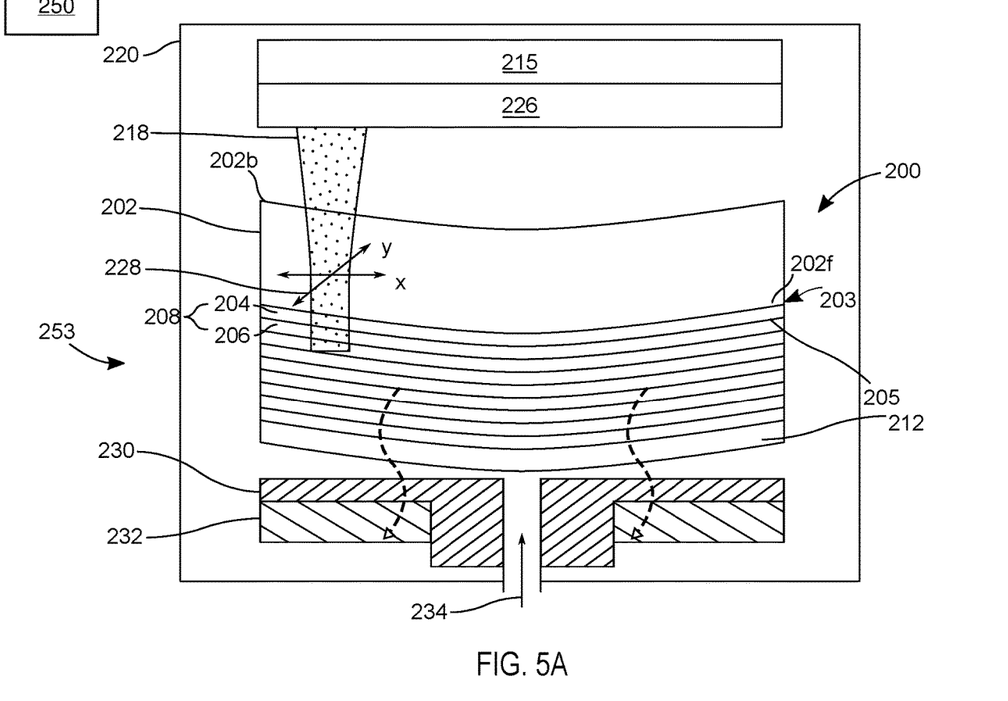
FIG. 5A illustrates an embodiment of an apparatus for improving the flatness of an EUV mask blank.

FIG. 4B shows an embodiment of an apparatus 252 configured to selectively heat a portion of the EUV mask blank 200 that comprises a heating device in the form of a light source 215. Is some embodiments, the light source 215 comprises a broadband white light source or a laser and there is a filter 224 configured to filter the light within a predetermined wavelength range that will transmit through the substrate 202. The embodiment shown in FIG. 4B further comprises a cooling device 216, which in some embodiments, includes one or more of a fan, cooling coils with coolant fluid (gas or liquid flowing through the coils) and a cryocooler, FIG. 5A shows an embodiment of an apparatus 253 configured to selectively heat a portion of the EUV mask blank 200. The apparatus comprises a light source 215 with an optical device 226 positioned between the light source 215 and the EUV mask blank 200. The optical device 226 can comprise lens or a plurality of lenses. The embodiment shown in FIG. 5A shows a pedestal 230 configured to support the EUV mask blank 200. The apparatus 253 in FIG. 5A further comprises a pedestal cooling device 232. The pedestal cooling device 232 according to some embodiments includes one or more of a fan, cooling coils with coolant fluid (gas or liquid flowing through the coils) and a cryocooler. The embodiment shown in FIG. 5A further shows gas indicated by arrow 234, which may be provided by a gas source that can direct cooing gas toward the capping layer 212 of the EUV mask blank 200. The gas can be, for example, argon or nitrogen to improve heat transfer from the mask blank to the cooled pedestal. The apparatus 253 shown in FIG. 5A further comprises a fixture to move the light source 215 in an x-y plane as indicated by the axes 218.

Figure 5B:
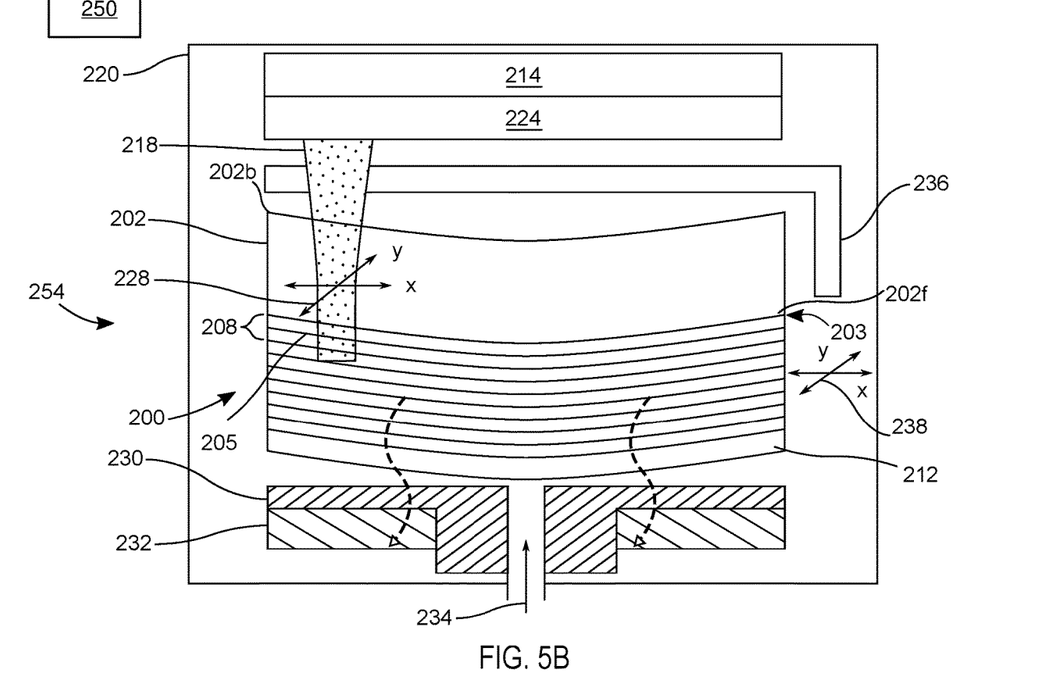
FIG. 5B illustrates an embodiment of an apparatus for improving the flatness of an EUV mask blank.

FIG. 5B shows another embodiments of an apparatus 254 configured to selectively heat a portion of the EUV mask blank 200. The apparatus 254 comprises the light source 215 with the filter 224 configured to filter the light within a predetermined wavelength range that will transmit through the substrate 202. The embodiment shown in FIG. 5B further shows gas indicated by arrow 234, which may be provided by a gas source that can direct cooing gas toward the capping layer 212 of the EUV mask blank 200. The apparatus 253 shown in FIG. 5B further comprises a fixture to move the light source 215 in an x-y plane as indicated by the axes 218. The apparatus 253 further comprises a scanning shutter 236 to shutter radiation 228 from the light source 214. The scanning shutter 236 may further include an x and y axis shutter fixture to control movement of scanning shutter 236 along the length and width of the EUV mask blank 200.

Figure 6:
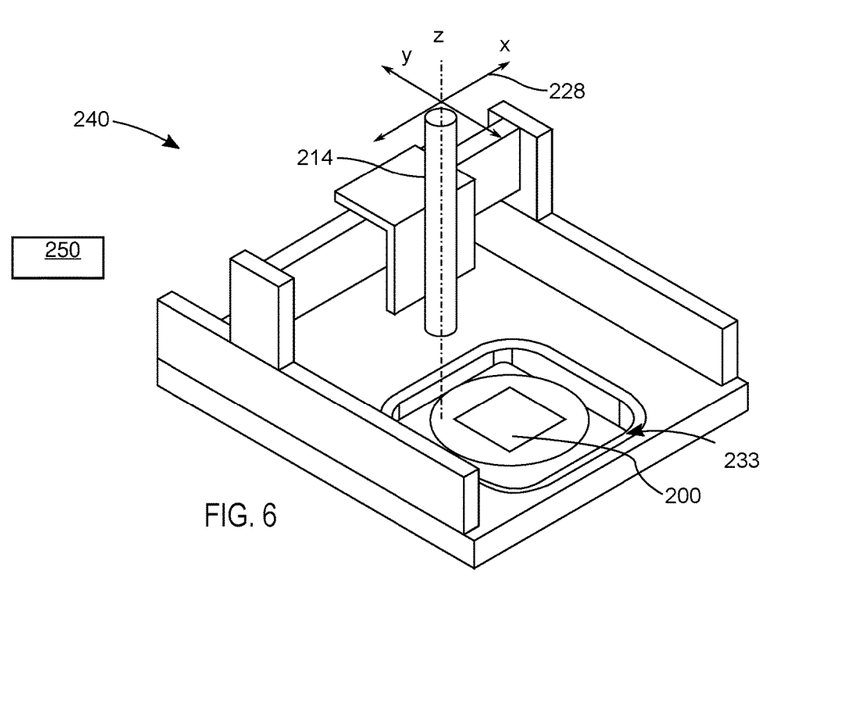
FIG. 6 illustrates an embodiment of an apparatus for improving the flatness of an EUV mask blank including a scanning fixture.

FIG. 6 is a perspective view of an exemplary embodiment of a scanning fixture 240 configured to scan the light source 214 in an x and y plane 228 with respect to the EUV mask blank 200 held in an EUV mask blank handling fixture 233. In one or more embodiments, the light source 215 and the EUV mask blank can be moved with respect to each other along the z axis so that the light source 214 and the EUV mask blank 200 can be moved further away or closer to each other.

Figure 7:
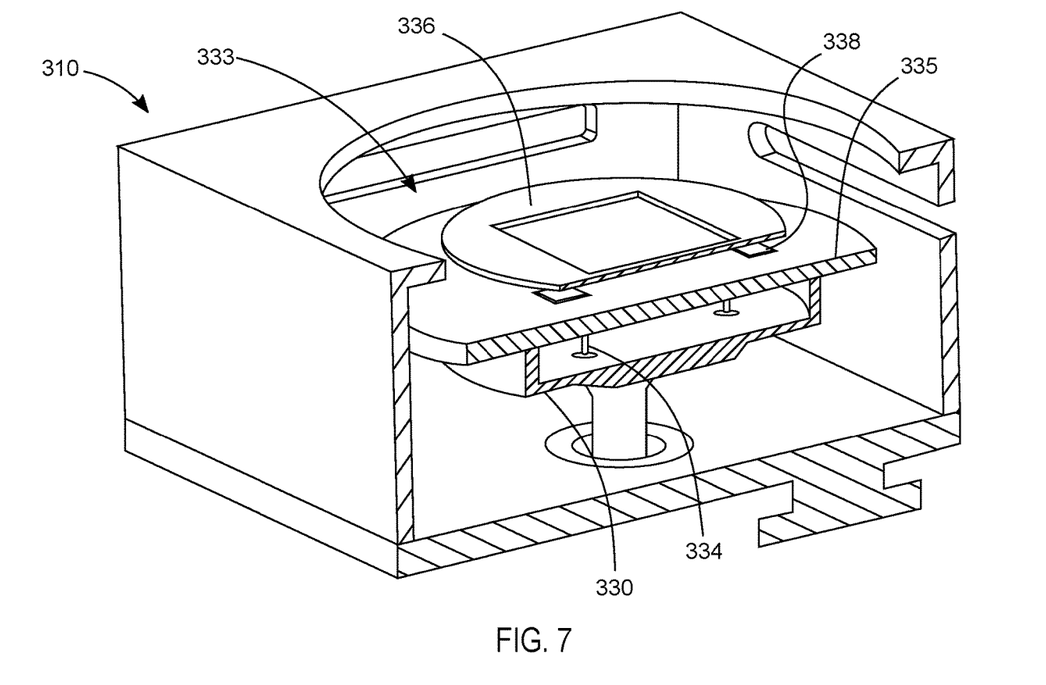
FIG. 7 is a perspective view illustrating an embodiment of an apparatus for improving the flatness of an EUV mask blank.
Figure 8:
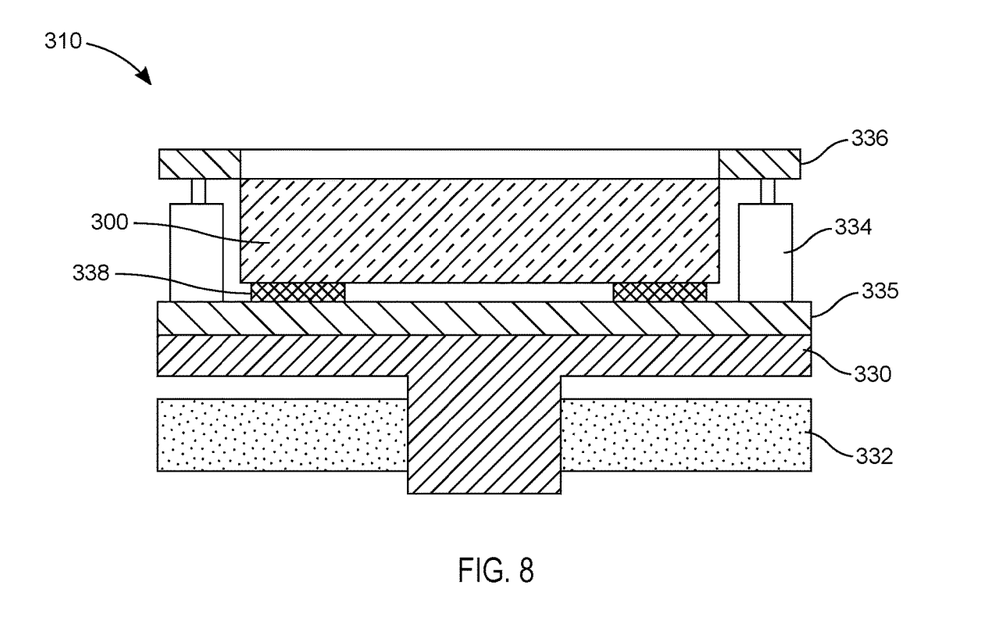
FIG. 8 is a side view of the apparatus shown in FIG. 7.

FIG. 7 is a perspective view according to one or more embodiments of a portion of an apparatus 310 configured to selectively heat a portion of an EUV mask blank. The apparatus 310 as shown includes an EUV mask blank handling fixture 333 including a carrier base 335 and a top shield 336 configured to hold the EUV mask blank 300 on the pedestal 330 during a selective heating process in the chambers disclosed herein. The apparatus shown in FIG. 7, which in FIG. 8 is shown in a side elevation, further comprises lift pins 334 configured to raise the top shield 336 above the EUV mask blank 300 during the selective heating process and a pad 338 configured to separate the EUV mask blank 300 from the carrier base 335 during the selective heating process. A pedestal cooling device 332 provides cooling to the pedestal 330. The pedestal cooling device 332 according to some embodiments includes one or more of a fan, cooling coils with coolant fluid (gas or liquid flowing through the coils) and a cryocooler.

In some embodiments, the mask blank handling fixture 333 is integrated in the chamber 220 on the pedestal 330 as shown on FIG. 7. The carrier base and a top shield which in some embodiments are made of a conductive material such as aluminum. The pad 338 separates the EUV mask blank from the carrier base, and the pins to separate top shield from the carrier base and EUV mask blank. In some embodiments, the pad 338 and the pins 334 made of a non-conductive material such as polyether ether ketone (PEEK). The selective area scanning can eliminate heating of undesired part including the top shield or pads and pins.

In an exemplary embodiment, the apparatus shown in FIGS. 7 and 8 can be integrated with the scanning fixture 240 shown in FIG. 6 such that a heater such as the light source 214 is positioned with respect to the EUV mask blank 300. The light source 214 is configured to direct light toward the pedestal 330 and to selectively heat a first portion of the EUV mask blank 300 to a first temperature while maintaining a second portion of the EUV mask blank 300 at a second temperature lower than the first temperature.

It will be appreciated that the mask blank shown in FIG. 8 can have the same configuration of the mask blank 200 described herein comprising the multilayer stack 210 reflective of EUV radiation and a capping layer 212.

The apparatus described herein in some embodiments can further include a controller 250 to control operation of the heater, the light source 214, the scanning fixture 240 and the cooling device to selectively heat a portion of the EUV mask blanks as described herein. In some embodiments an apparatus comprises a controller 250 configured to control movement of the scanning fixture and to control the light source to selectively heat the first portion of the EUV mask blank to the first temperature while maintaining the second portion of the EUV mask blank at the second temperature lower than the first temperature. In some embodiments, the first temperature is in a range of 150° C. to 300° C., while the second temperature is in a range of from 10° C. to less than 150° C. In specific embodiments, the first temperature is in a range of 180° C. to 250° C., while the second temperature is in a range of from 10° C. to less than 180° C.

In one or more embodiments, the light source 214 is selected from the group consisting of a helium-neon laser, an argon laser, a krypton laser, a xenon laser and a broadband white light source.

Thus according to one or more embodiments the apparatus or system described herein integrates of heating elements such as halogen lamps, light sources, lasers or broadband white light laser/sources. Further integrations can include one or more of an optical device such as one or more lenses, a wavelength filter, and a scanning shutter. By utilizing a desired wavelength, scanning optics (galvanometer scanner)/mechanics and/or or shutters to heat specific area, the EUV mask blank can be selectively heated. A cooling device such as a pedestal cooling device provides further selective heating control.

In one or more embodiments, by controlling bottom 2-20 (e.g., 3-15 or 3 to 10) layer pairs 208 adjacent to the substrate 202, which contribute to <2% reflectance and transfer a large percentage of the multilayer stress on the substrate 202, reduces distortion and non-flatness of mask blank. Selective heating of the bottom 2-20 (e.g., 3-15 or 3 to 10) layer pairs 208 to a first temperature while maintaining the other layer pairs 208 at a second temperature cooler than the first temperature relieves the stress from multilayer stack 210 on the substrate 202. Thus, the EUV mask blank is rendered flat and total reflectance remains high.

Specific examples of light sources include halogen bulbs, lasers (e.g., helium-neon laser, krypton laser) having a wavelength in a range of 300-2500 nm has greater than 80%, greater than 85% or greater than 90% transmission though the EUV mask blank substrate 202, in particular low expansion glass substrates as described herein. As such, by controlling the wavelength with an optical device, a filter and/or a shutter, the radiation (light) can transmit through the substrate and heat the bottom 2-20 layer pairs 208.

Thus a selective heating process of some embodiments can be performed in a vacuum chamber with top heating elements (e.g. halogen lamp array or a laser array generating light of wavelength in a range of 300-2500 nm, 400-2500 nm, 300-800 nm or 400-800 nm. An EUV mask blank is placed under the light source 214 with the back side of the substrate facing towards the lamp. As provided herein, the substrate material can be ultralow expansion glass or fused silica which is transparent to the light from halogen lamp and thus not heated by the halogen lamp.

In an exemplary embodiment of the disclosure, the top heating element can be a divergence laser with specific wavelength or broadband white light laser/sources with filter for wavelength selection. The Light source (laser or lamp) can be controlled in millisecond or microsecond for precise annealing control using the controller 250. In one or more embodiments of the disclosure, multiple types of laser can be used. For example, a helium-neon laser can be used operating at the following wavelengths: 632.8 nm, 543.5 nm, 593.9 nm, 611.8 nm, 1.1523 µm, 1.52 µm, or 3.3913 µm. In another embodiment of the disclosure, an argon laser can be used operating at the following wavelengths: 454.6 nm, 488.0 nm, 514.5 nm, 351 nm, 363.8, 457.9 nm, 465.8 nm, 476.5 nm, 472.7 nm, or 528.7 nm. Also, the frequency can be doubled to provide 244 nm, or 257 nm. In another embodiment of the disclosure, a krypton laser can be used operating at the following wavelengths: 416 nm, 530.9 nm, 568.2 nm, 647.1 nm, 676.4 nm, 752.5 nm, or 799.3 nm. In another embodiment of the disclosure, Xenon ion laser can be used operating under many lines throughout visible spectrum extending into the UV and IR.

In another embodiment of the disclosure, broadband white light laser/sources can be used operating under many lines throughout visible spectrum extending into the UV and IR. In one or more embodiments of the disclosure, the top heating element can be a focused laser beam with scanning optics to control the position of laser beam (e.g., a galvanometer scanner) or a broadband white light laser/sources with filter for wavelength selection and scanning shutter. In one or more embodiments of the disclosure, scanning optics and/or a scanning shutter can be used to heat selected area of EUV mask blank. Light source (laser or lamp) can be controlled in millisecond or microsecond for precise annealing control.

Figure 9:
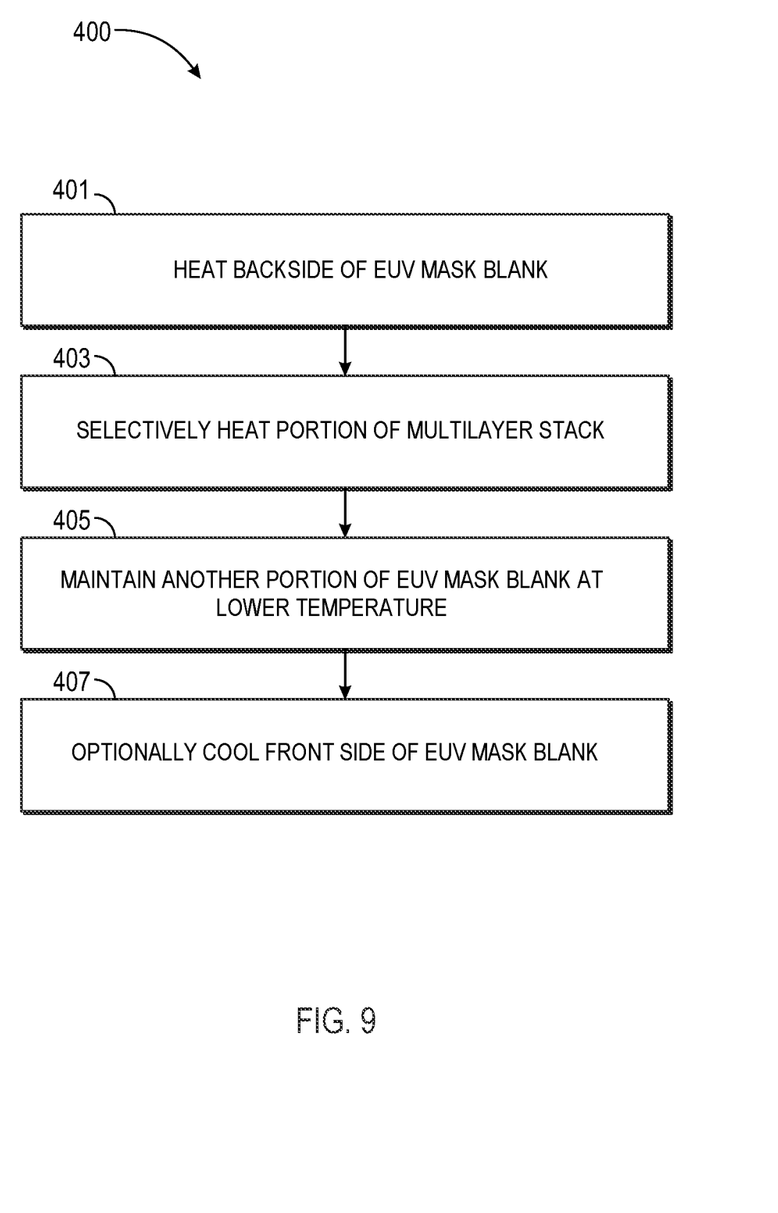
FIG. 9 is a flowchart of a method according to one or more embodiments of the disclosure.

Referring now to FIG. 9, a method 400 of manufacturing an extreme ultraviolet (EUV) mask blank comprises at 401 heating a backside of an EUV mask blank, at 403 selectively heating a portion of a multilayer stack of the EUV mask blank, at 405 maintaining another portion of the EUV mask bland at a lower temperature than the selectively heated portion and at 407 optionally cooling a front side of the EUV mask blank.

In specific embodiments, the method comprises heating the EUV mask blank comprising a multilayer stack which reflects EUV radiation on a front side of a substrate having the front side and a backside opposite the front side, the multilayer stack comprising a number X of reflective layer pairs, wherein an x is in a range of from 30 to 60. The method further comprises selectively heating a number Y reflective layer pairs adjacent to the substrate to a first temperature, wherein Y is an integer in a range of from 1 to 20/ The method further comprises maintaining reflective layer pairs above the Y reflective layer pairs at a second temperature that is less than the first temperature.

In some embodiments, maintaining the reflective layer pairs above the Y reflective layer pairs at a second temperature comprises cooling the reflective layer pairs above the Y reflective layer pairs. In some embodiments, x is in a range of from 36 to 54 and Y is in a range of from 2 to 10. In some embodiments, Y is in a range of from 3 to 7. According to some embodiments, heating the Y reflective layer pairs comprises directing light from a light source having a transmission through the substrate of greater than 80% through the substrate at the backside of the substrate.

In some embodiments, the substrate comprises low expansion aluminosilicate glass or fused silica. In some embodiments, selectively heating is performed for a period of time in a range of from five minutes to 60 minutes, for example 10 to 60 minutes, 15 to 60 minutes, 20 to 60 minutes, 30 to 60 minutes, 40 to 60 minutes, five minutes to 50 minutes, five minutes to 40 minute five minutes to 30 minutes, five minutes to 20 minutes or five minutes to ten minutes.

According to one or more embodiments, advantages of the apparatus and methods includes selectively layer pairs 208 and heat can be applied to specific areas such as the top shield of an EUV mask blank handling fixture. Heating of undesired parts of the apparatus can be eliminated. A cooling device or system can be used to protect non-heated layer pairs.

Methods may generally be stored in the controller, which may comprise a processor and memory. The controller may utilize a software routine that, when executed by the processor, causes the apparatus to perform methods of the present disclosure. The software routine may also be stored and/or executed by a second processor (not shown) that is remotely located from the hardware being controlled by the processor. Some or all of the methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an extreme ultraviolet (EUV) mask blank comprising:
heating the EUV mask blank comprising a multilayer stack which reflects EUV radiation on a front side of a substrate having the front side and a backside opposite the front side, the multilayer stack comprising a number X of reflective layer pairs, wherein an x is in a range of from 30 to 60;
selectively heating a number Y reflective layer pairs adjacent to the substrate to a first temperature, wherein Y is an integer in a range of from 1 to 20; and
maintaining reflective layer pairs above the Y reflective layer pairs at a second temperature that is less than the first temperature.

2. The method of claim 1, wherein maintaining the reflective layer pairs above the Y reflective layer pairs at a second temperature comprises cooling the reflective layer pairs above the Y reflective layer pairs.

3. The method of claim 1, wherein an x is in a range of from 36 to 54 and Y is in a range of from 2 to 10.

4. The method of claim 3, wherein y is in a range of from 3 to 7.

5. The method of claim 3, wherein heating the Y reflective layer pairs comprises directing light from a light source having a transmission through the substrate of greater than 80% through the substrate at the backside of the substrate.

6. The method of claim 5, wherein the substrate comprises low expansion aluminosilicate glass.

7. The method of claim 5, wherein the substrate comprises fused silica.

8. The method of claim 5, wherein the light comprises a wavelength in a range of from 300 nm to 2500 nm.

9. The method of claim 8, wherein the light comprises a wavelength in a range of from 300 nm to 800 nm.

10. The method of claim 5, wherein the first temperature is in a range of 150° C. to 300° C., while the second temperature is in a range of from 10° C. to less than 150° C.

11. The method of claim 5, wherein the first temperature is in a range of 180° C. to 250° C., while the second temperature is in a range of from 10° C. to less than 180° C.

12. The method of claim 10, wherein selectively heating is performed for a period of time in a range of from five minutes to 60 minutes.

13. The method of claim 8, wherein the light source is selected from the group consisting of a helium-neon laser, an argon laser, a krypton laser, a xenon laser and a broadband white light source.

14. An apparatus configured to selectively heat a portion of an EUV mask blank, the apparatus comprising:
- a chamber including a pedestal configured to support the EUV mask blank;
- an EUV mask blank handling fixture including a carrier base and a top shield configured to hold the EUV mask blank on the pedestal during a selective heating process in the chamber;
- lift pins configured to raise the top shield above the EUV mask blank during the selective heating process and a pad configured to separate the EUV mask blank from the carrier base during the selective heating process; and
- a light source positioned and configured to direct light toward the pedestal and to selectively heat a first portion of the EUV mask blank to a first temperature while maintaining a second portion of the EUV mask blank at a second temperature lower than the first temperature.

15. The apparatus of claim 14, wherein the pedestal further comprises a cooling device configured to cool the pedestal and portion of the EUV mask blank during a selective heating process.

16. The apparatus of claim 15, further comprising a scanning fixture configured to scan the light source in an x and y plane with respect to the EUV mask blank handling fixture.

17. The apparatus of claim 16, further comprising a controller configured to control movement of the scanning fixture and to control the light source to selectively heat the first portion of the EUV mask blank to the first temperature while maintaining the second portion of the EUV mask blank at the second temperature lower than the first temperature.

18. The apparatus of claim 17, wherein the first temperature is in a range of 150° C. to 300° C., while the second temperature is in a range of from 10° C. to less than 150° C.

19. The apparatus of claim 17, wherein the first temperature is in a range of 180° C. to 250° C., while the second temperature is in a range of from 10° C. to less than 180° C.

20. The apparatus of claim 17, wherein the light source is selected from the group consisting of a helium-neon laser, an argon laser, a krypton laser, a xenon laser and a broadband white light source.

* * * * *